(12) United States Patent
Shusterman et al.

(10) Patent No.: US 11,437,273 B2
(45) Date of Patent: Sep. 6, 2022

(54) SELF-ALIGNED CONTACT AND CONTACT OVER ACTIVE GATE STRUCTURES

(71) Applicant: Mircomaterials LLC, Wilmington, DE (US)

(72) Inventors: Yuriy Shusterman, Ballston Lake, NY (US); Madhur Sachan, Belmont, CA (US); Susmit Singha Roy, Sunnyvale, CA (US); Regina Freed, Los Altos, CA (US); Sanjay Natarajan, Portland, OR (US)

(73) Assignee: Micromaterials LLC, Wilmington, DE (US)

( * ) Notice: Subject to any disclaimer, the term of this patent is extended or adjusted under 35 U.S.C. 154(b) by 0 days.

(21) Appl. No.: 16/798,817

(22) Filed: Feb. 24, 2020

(65) Prior Publication Data

US 2020/0279773 A1    Sep. 3, 2020

Related U.S. Application Data

(60) Provisional application No. 62/812,575, filed on Mar. 1, 2019.

(51) Int. Cl.
*H01L 21/768* (2006.01)
*H01L 29/417* (2006.01)
(Continued)

(52) U.S. Cl.
CPC .. *H01L 21/76897* (2013.01); *H01L 21/76808* (2013.01); *H01L 21/76843* (2013.01);
(Continued)

(58) Field of Classification Search
CPC ......... H01L 21/76897; H01L 29/66545; H01L 29/66666; H01L 29/7827;
(Continued)

(56) References Cited

U.S. PATENT DOCUMENTS 9,041,217 B1    5/2015   Bristol et al.
9,530,733 B2   12/2016   Bristol et al.
(Continued)

FOREIGN PATENT DOCUMENTS

WO    2016209205 A1   12/2016
WO    2016209296 A1   12/2016

OTHER PUBLICATIONS

Auth, C. , et al., "A 10nm High Performance and Low-Power CMOS Technology Featuring 3rd Generation FinFET Transistors, Self-Aligned Quad Patterning, Contact over Active Gate and Cobalt Local Interconnects", IEDMI 17, 2017, 673-676.
(Continued)

*Primary Examiner* — Maliheh Malek
(74) *Attorney, Agent, or Firm* — Servilla Whitney LLC

(57) ABSTRACT

Methods of forming and processing semiconductor devices which utilize a three-color process are described. Certain embodiments relate to the formation of self-aligned contacts for metal gate applications. More particularly, certain embodiments relate to the formation of self-aligned gate contacts utilizing the formation of self-aligned growth pillars. The pillars lead to taller gate heights and increased margins against shorting defects.

8 Claims, 12 Drawing Sheets

(51) Int. Cl.
*H01L 21/8234* (2006.01)
*H01L 29/66* (2006.01)
*H01L 29/423* (2006.01)
*H01L 29/49* (2006.01)
*H01L 29/45* (2006.01)
H01L 27/088 (2006.01)

(52) U.S. Cl.
CPC ............. *H01L 21/823437* (2013.01); *H01L 21/823475* (2013.01); *H01L 29/41775* (2013.01); *H01L 29/42372* (2013.01); *H01L 29/45* (2013.01); *H01L 29/4958* (2013.01); *H01L 29/6653* (2013.01); *H01L 29/6656* (2013.01); *H01L 21/823431* (2013.01); *H01L 27/0886* (2013.01); *H01L 2221/1026* (2013.01)

(58) Field of Classification Search
CPC ....... H01L 21/823487; H01L 21/76834; H01L 23/5226; H01L 23/528; H01L 27/088; H01L 29/66795; H01L 21/823418; H01L 21/31144; H01L 21/76816; H01L 21/823475; H01L 21/823481; H01L 29/785; H01L 21/76802; H01L 21/76808; H01L 21/76849; H01L 21/76883; H01L 21/823431; H01L 23/53295; H01L 27/0886; H01L 29/41791; H01L 29/42392; H01L 29/6653; H01L 29/6656; H01L 29/78696; H01L 21/76801; H01L 21/76807; H01L 21/76831; H01L 21/76832; H01L 21/76877; H01L 21/823412; H01L 21/823437; H01L 21/823468; H01L 21/823821; H01L 21/823878; H01L 21/823885; H01L 27/092; H01L 27/0924; H01L 29/66553; H01L 29/7848; H01L 2029/7858; H01L 21/02532; H01L 21/0337; H01L 21/28518; H01L 21/31111; H01L 21/321; H01L 21/32134; H01L 21/76811; H01L 21/76885; H01L 21/76895; H01L 21/823462; H01L 21/823814; H01L 21/823828; H01L 21/823842; H01L 21/823864; H01L 21/823871; H01L 2221/1026; H01L 23/53238; H01L 23/53252; H01L 23/53257; H01L 23/53266; H01L 27/0922; H01L 27/105; H01L 27/10814; H01L 27/1104; H01L 27/2454; H01L 27/2463; H01L 29/0653; H01L 29/0673; H01L 29/0847; H01L 29/165; H01L 29/41733; H01L 29/41775; H01L 29/42356; H01L 29/45; H01L 29/4966; H01L 29/4991; H01L 29/66439; H01L 29/665; H01L 29/66742; H01L 2924/00; H01L 2924/0002; H01L 21/02167; H01L 21/0217; H01L 21/02244; H01L 21/02603; H01L 21/0332; H01L 21/0335; H01L 21/0338; H01L 21/26513; H01L 21/28008; H01L 21/28026; H01L 21/28088; H01L 21/283; H01L 21/2855; H01L 21/28562; H01L 21/28568; H01L 21/288; H01L 21/30604; H01L 21/3065; H01L 21/308; H01L 21/3105; H01L 21/31058; H01L 21/311; H01L 21/3115; H01L 21/32; H01L 21/32051; H01L 21/32055; H01L 21/32133; H01L 21/32136; H01L 21/32139; H01L 21/485; H01L 21/486; H01L 21/67138; H01L 21/67184; H01L 21/67207; H01L 21/6831; H01L 21/76224; H01L 21/76804; H01L 21/76813; H01L 21/76814; H01L 21/7682; H01L 21/76826; H01L 21/76829; H01L 21/76837; H01L 21/76841; H01L 21/7685; H01L 21/76864; H01L 21/76873; H01L 21/76879; H01L 21/8221; H01L 21/823425; H01L 21/8238; H01L 21/823807; H01L 21/84; H01L 2221/1031; H01L 2221/1063; H01L 2224/16225; H01L 23/3171; H01L 23/485; H01L 23/5286; H01L 23/53209; H01L 23/53228; H01L 23/5329; H01L 27/0203; H01L 27/0928; H01L 27/1052; H01L 27/10873; H01L 27/10876; H01L 27/10882; H01L 27/10885; H01L 27/1116; H01L 27/228; H01L 27/24; H01L 29/0649; H01L 29/1037; H01L 29/402; H01L 29/407; H01L 29/41741; H01L 29/42364; H01L 29/42376; H01L 29/42384; H01L 29/456; H01L 29/4975; H01L 29/4983; H01L 29/515; H01L 29/66484; H01L 29/66583; H01L 29/66636; H01L 29/6681; H01L 29/78; H01L 29/783; H01L 29/7855; H01L 29/786; H01L 29/78642; H01L 29/78648; H01L 29/78684; H01L 43/12; H01L 45/06; H01L 45/1206; H01L 45/124; H01L 45/126; H01L 45/1286; H01L 45/144; H01L 45/1608; H01L 45/1666; H01L 45/1675; H01L 21/76843; H01L 29/42372; H01L 29/4958; H01L 29/0924

See application file for complete search history.

(56) References Cited

U.S. PATENT DOCUMENTS

| | | | | |
|---|---|---|---|---|
| 9,842,927 B1* | 12/2017 | Zang | ................ | H01L 29/4975 |
| 10,014,303 B2* | 7/2018 | Zang | ................ | H01L 29/66545 |
| 10,410,927 B1* | 9/2019 | Cheng | ............ | H01L 21/823431 |
| 10,985,073 B2* | 4/2021 | Xie | ................ | H01L 29/66545 |
| 2009/0148992 A1* | 6/2009 | Oyu | ................ | H01L 29/66666 |
| | | | | 438/587 |
| 2010/0216289 A1* | 8/2010 | Park | ................ | H01L 29/456 |
| | | | | 257/E21.41 |
| 2011/0140195 A1* | 6/2011 | Zahurak | ............ | H01L 27/105 |
| | | | | 257/329 |
| 2013/0234242 A1* | 9/2013 | Hwang | ............ | H01L 27/10876 |
| | | | | 438/270 |
| 2013/0320433 A1* | 12/2013 | Cho | ................ | H01L 21/28026 |
| | | | | 257/329 |
| 2014/0077305 A1 | 3/2014 | Pethe et al. | | |
| 2015/0206923 A1* | 7/2015 | Masuoka | ........ | H01L 21/823487 |
| | | | | 257/295 |
| 2016/0240774 A1* | 8/2016 | Masuoka | ............ | H01L 45/1608 |
| 2017/0263551 A1 | 9/2017 | Bristol et al. | | |
| 2017/0278752 A1 | 9/2017 | Ryckaert et al. | | |
| 2017/0330761 A1 | 11/2017 | Chawla et al. | | |
| 2017/0330794 A1 | 11/2017 | Hourani et al. | | |
| 2018/0337188 A1* | 11/2018 | Yu | ................ | H01L 21/823828 |
| 2018/0374750 A1* | 12/2018 | Zhang | ............ | H01L 21/67138 |
| 2019/0273019 A1* | 9/2019 | Mullick | ............ | H01L 21/32134 |
| 2019/0334008 A1* | 10/2019 | Chen | ................ | H01L 21/823468 |
| 2019/0355621 A1* | 11/2019 | Marcadal | ............ | H01L 21/76834 |
| 2019/0378756 A1* | 12/2019 | Mullick | ............ | H01L 23/5226 |
| 2020/0083106 A1* | 3/2020 | Cheng | ............ | H01L 21/823418 |
| 2020/0126844 A1* | 4/2020 | Panda | ................ | H01L 21/76864 |
| 2020/0135887 A1* | 4/2020 | Wu | ................ | H01L 21/3115 |

(56) References Cited

U.S. PATENT DOCUMENTS

| | | | |
|---|---|---|---|
| 2020/0168606 A1* | 5/2020 | Chan | H01L 29/66545 |
| 2020/0258744 A1* | 8/2020 | Thareja | H01L 29/45 |
| 2020/0312849 A1* | 10/2020 | Cheng | H01L 29/66795 |
| 2020/0365701 A1* | 11/2020 | Ku | H01L 29/786 |
| 2021/0013106 A1* | 1/2021 | Xie | H01L 21/823437 |
| 2021/0066120 A1* | 3/2021 | Yang | H01L 21/76877 |
| 2021/0098597 A1* | 4/2021 | Xie | H01L 29/7827 |
| 2021/0351079 A1* | 11/2021 | Su | H01L 29/42392 |
| 2022/0005937 A1* | 1/2022 | Stolfi | H01L 29/0673 |
| 2022/0028999 A1* | 1/2022 | Chang | H01L 29/66795 |
| 2022/0130722 A1* | 4/2022 | Parikh | H01L 21/76816 |

OTHER PUBLICATIONS

Clark, R., et al., "Perspective: New process technologies required for future devices and scaling", Apl Materials 6, 058203, May 29, 2018, 1-12.

* cited by examiner

SELF-ALIGNED CONTACT AND CONTACT OVER ACTIVE GATE STRUCTURES

CROSS-REFERENCE TO RELATED APPLICATIONS

This application claims priority to U.S. Provisional Application No. 62/812,575, filed Mar. 1, 2019, the entire disclosure of which is hereby incorporated by reference herein.

TECHNICAL FIELD

Embodiments of the present invention pertain to the field of semiconductor device manufacturing and methods for device patterning. In particular, embodiments pertain to the electrical contacts in a transistor device and methods of forming self-aligned contacts and contact over active gate structures.

BACKGROUND

Reducing the size of integrated circuits (ICs) results in improved performance, increased capacity, and/or reduced cost. Each size reduction requires more sophisticated techniques to form the ICs. Shrinking transistor size, for example, allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of ICs, multi-gate transistors have become more prevalent as device dimensions continue to scale down. Scaling multi-gate transistors has not been without consequence, however. As the dimensions of these fundamental building blocks of microelectronic circuitry are reduced, and as the number of building blocks fabricated in a given region increases, the constraints on the lithographic processes used to pattern these building blocks becomes overwhelming.

Photolithography is commonly used to pattern ICs on a substrate. An exemplary feature of an IC is a line of a material which may be a metal, semiconductor, or insulator. Due to factors such as optics and light or radiation wavelength, however, photolithography techniques are restricted by a minimum pitch, below which a particular photolithographic technique may not reliably form features. Thus, the minimum pitch of a photolithographic technique can limit feature size reduction of ICs.

Processes such as self-aligned double patterning (SADP), self-aligned quadruple patterning (SAQP), and litho-etch-litho-etch (LELE) may be used for extending the capabilities of photolithographic techniques beyond the minimum pitch capabilities of existing lithographic equipment. Following the SADP, SAQP, or LELE process, multi-cut or block masks are placed over the lines and spaces generated by SADP, SAQP, or LELE processes to perform device patterning. As the feature size decreases, pitch and linewidth also decrease.

In the manufacturing of self-aligned contacts (SAC), a protective silicon nitride (SiN) cap is installed above the gate to enable larger tolerance against shorts arising from next-layer overlay errors. Similarly, in the manufacturing of contact over active gate (COAG) structures, dielectric caps are used to enable larger tolerance against shorts that arise from next-layer overlay errors. During this processing, however, gate height is lost at multiple points, leading to a reduced thickness in the protective caps and reduced margin against shorts. Therefore, there is a need for improved devices, and methods of manufacturing said devices, having taller gate heights and increased margin against shorting defects.

SUMMARY

One or more embodiments of the disclosure are directed to electronic devices and to methods of manufacturing the electronic devices. In one embodiment, an electronic device comprises a substrate having an active region with at least one gate stack formed thereon, the at least one gate stack having a first side and a second side and comprising a source/drain and a gate metal. A source/drain contact is on the source/drain. A first dielectric is on the contact. A spacer material is adjacent the first side and the second side of the at least one gate stack, and a second dielectric is on the at least one gate stack. The gate metal has a thickness in a range of about 0.5 nm to about 2000 nm and the second dielectric has a thickness in a range of 0.5 nm to about 2000 nm.

In one embodiment, a method of manufacturing an electronic device comprises providing a substrate having an active region with at least one gate stack formed thereon, the at least one gate stack having a first side and a second side and comprising a gate metal having a thickness in a range of 0.5 nm to about 2000 nm, a source/drain on the substrate, and a sacrificial material on the source/drain. Pillars are formed on the gate metal. A spacer material is formed on the first side and second side of the pillars. The sacrificial material is removed to form an opening to the source/drain. A metal is deposited in the opening to form a source/drain contact. The pillars are removed to form trenches, and a dielectric material is deposited through the trenches onto the gate metal.

In one an embodiment, an electronic device comprises a substrate having an active region with at least one gate stack formed thereon, the at least one gate stack having a first side and a second side and comprising a source/drain and a gate metal. A source/drain contact is on the source/drain, and a dielectric is on the at least one gate stack. The gate metal has a thickness in a range of 0.5 nm to about 2000 nm and the dielectric has a thickness in a range of 0.5 nm to about 2000 nm.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
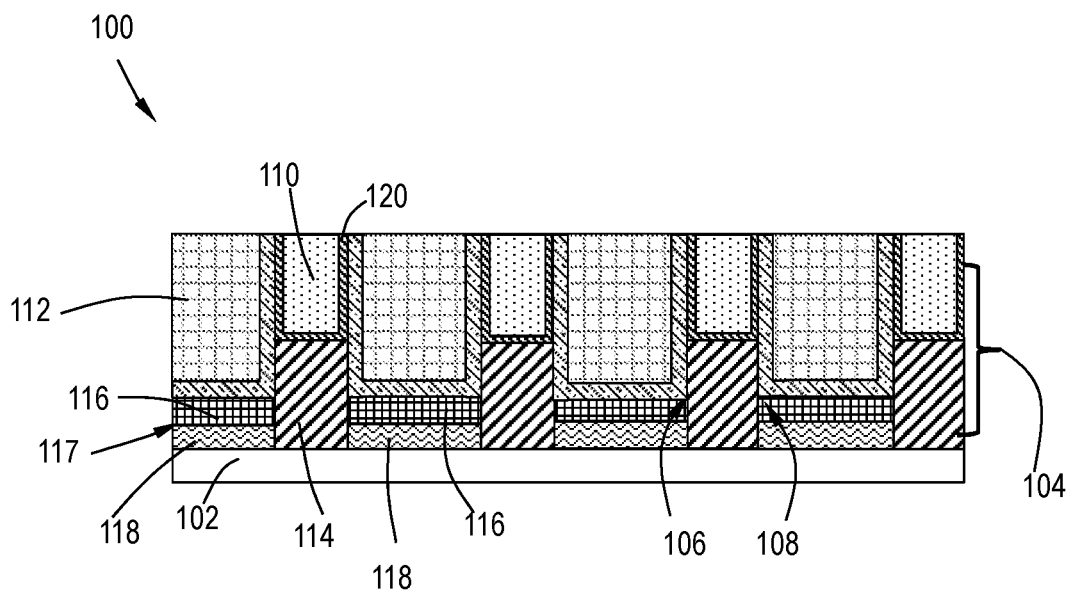
FIG. 1 illustrates a cross-section view of an electronic device according to one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

As used in this specification and the appended claims, the term "linewidth" refers to the width of the line of a material which may be a metal, semiconductor, or insulator, and the term "spacing" refers to the distance between adjacent lines. As used in this specification and the appended claims, the term "pitch" is defined as the distance between a same point on two adjacent lines. The pitch is equal to the sum of the linewidth and the spacing.

One or more embodiments of the present disclosure are directed to semiconductor structures or devices having one or more gate contact structures (e.g. gate contact vias) disposed over active portions of gate electrodes of the semiconductor structures or devices.

Transistors are circuit components or elements that are often formed on semiconductor devices. Many transistors may be formed on a semiconductor device in addition to capacitors, inductors, resistors, diodes, conductive lines, or other elements, depending upon the circuit design. The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals.

Generally, a transistor includes a gate formed between source and drain regions. The source and drain regions may include a doped region of a substrate and may exhibit a doping profile suitable for a particular application. The gate is positioned over the channel region and may include a gate dielectric interposed between a gate electrode and the channel region in the substrate.

As used herein, the term "field effect transistor" or "FET" refers to a transistor that uses an electric field to control the electrical behavior of the device. Field effect transistors generally display very high input impedance at low temperatures. The conductivity between the drain and source terminals is controlled by an electric field in the device, which is generated by a voltage difference between the body and the gate of the device.

As used in this specification and the appended claims, the term COAG "contact over active gate" or "COAG" refers to a process feature whereby the gate contact is stacked on top of the gate where there is an active region underneath, thereby improving transistor density. COAG is a feature that provides an additional 10% area scaling.

A COAG semiconductor structure or device includes a diffusion or active region disposed in a substrate, and within an isolation region. One or more gate lines (also known as polylines) are disposed over the diffusion or active region as well as over a portion of the isolation region. Source or drain contacts are disposed over source and drain regions of the semiconductor device. Source or drain contact vias provide contact to sources or drains. A separate gate contact, and overlying gate contact via, provides contact to a gate line.

Typically, in the fabrication of COAG structures, at least a four-color scheme is necessary, creating challenges for integration, material, and etching. As used herein, the term "four-color" refers to four different materials which are selectively etchable relative to each other. The more colors required, the more complex/difficult etching becomes. Additionally, current COAG schemes have low process margin for existing etch processes.

Some embodiments of the disclosure advantageously provide methods to enable self-aligned contact over active gate (COAG) using a three-color processing scheme. The three-color processing scheme of one or more embodiments advantageously reduces one color for multiple color processes, relieving etch/material burden; eliminates a metal recess step, which is significant for cobalt (Co) or copper (Cu); is a self-aligned process; and extends gate pillar height, thus counteracting gate height loss. Additionally, the processing scheme of one or more embodiments increases the margin against shorting defects.

The embodiments of the disclosure are described by way of the Figures, which illustrate processes for forming contacts in accordance with one or more embodiments of the disclosure as exemplary process flows using a three-color process. The term "three-color" refers to three different materials which are selectively etchable relative to each other. In other words, one material will be etched, while the other two materials will not be etched. The processes shown are merely illustrative possible uses for the disclosed processes, and the skilled artisan will recognize that the disclosed processes are not limited to the illustrated applications.

As used herein, the term "active region" refers to a region which comprises active areas that play an active role in the functioning of a semiconductor device. For example, in a semiconductor substrate having formed thereon a field effect transistor (FET), an active region typically refers to a substrate area having formed thereon various sub-features of the field effect transistor, including, e.g., a source, a drain, and a channel connecting the source and the drain. A gate stack is located over the active region and typically covers a portion thereof. The gate stack may, for example, cover at least a portion of the channel in a field effect transistor. A gate dielectric is typically located between a gate electrode and the active region and prevents a direct electrical contact there-between. A spacer material is typically an electrically insulating material which shields the gate electrode from electrical contact along the lateral sides.

As used herein, when a first material is said to be etched selectively with respect to a second material, this means that the first material is etched faster than the second material. For example, the etching process would etch the first material at least two times faster, or at least five times faster, or at least ten times faster, than the second material.

In one or more embodiments, the contacts formed are self-aligned. As used herein, the term "self-aligned contact" refers to a kind of self-aligned via. If the via (contact) patterning has a pattern placement error, the bottom of the via or part of the via is still determined by the top edge of the bottom metal.

One or more embodiments of the disclosure advantageously provide three-color processes for forming electronic devices and contacts. FIGS. 1-11 illustrate an electronic device 100 formed according to the method of one or more embodiments of the disclosure. The electronic device 100 can be referred to as a metal gate, a transistor, a transistor gate, and the like. The individual components of the electronic device 100, include a substrate 102 having an active region with at least one gate stack 104 formed thereon. The at least one gate stack 104 has a first side 106 and a second side 108 and comprises a source 116, a drain 118, and a gate metal 110. The at least one gate stack 104, the source 116, the drain 118, and the gate metal 110 can be formed by any suitable process or processes known to the skilled artisan. In one or more embodiments, the electronic device 100 of FIG. 1 is produced by a replacement metal gate (RMG) process followed by a planarization (e.g. chemical mechanical planarization) step.

Referring to FIG. 1, the electronic device 100 has a substrate 102 with at least one gate stack 104 formed thereon. The at least one gate stack 104 has a first side 106 and a second side 108 on opposite sides of the at least one gate stack 104. The at least one gate stack 104 comprises a gate metal 110 and a work-function material 114.

The substrate 102 can be any suitable substrate material. In one or more embodiments, the substrate 102 comprises a semiconductor material, e.g., silicon (Si), carbon (C), germanium (Ge), silicon germanium (SiGe), galloum arsenide (GaAs), indium phosphorus (InP), indium galloum arsenide (InGaAs), indium aluminum arsenide (InAlAs), other semiconductor materials, or any combination thereof. In some embodiments, substrate 102 is a semiconductor-on-isolator (SOI) substrate including a bulk lower substrate, a middle insulation layer, and a top monocrystalline layer. The top monocrystalline layer may comprise any material listed above, e.g., silicon (Si). In various embodiments, the substrate 102 can be, e.g., an organic, a ceramic, a glass, or a semiconductor substrate. Although a few examples of materials from which the substrate may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present invention.

As will be recognized by one of skill in the art, the at least one gate stack 104 may be comprised of several different materials including, but not limited to, amorphous silicon, one or more metal, and the like.

As will be recognized by one of skill in the art, FIG. 1 is a starting point from where the FIN and work-function material 114 have been formed. In one or more embodiments, the at least one gate stack 104 comprises a gate metal 110 on the FIN and work-function material 114. The gate metal 110 may be any suitable metal known to one of skill in the art. In one or more embodiments, the gate metal 110 comprises a metal selected from one or more of cobalt (Co), tungsten (W), titanium (Ti), molybdenum (Mo), nickel (Ni), ruthenium (Ru), silver (Ag), iridium (Ir), or platinum (Pt).

As used herein, the term "work-function" refers to the bulk chemical potential of a material (e.g. metal) relative to the vacuum level. In one or more embodiments, the work-function material 114 has a work function greater than or equal to 4.3 eV. In some embodiments, the work-function material 114 has a work function greater than or equal to 4.5 eV. In other embodiments, the work-function material 114 has a work-function greater than or equal to 4.3 eV, including greater than or equal to 4.4 eV, greater than or equal to 4.5 eV, greater than or equal to 4.6, greater than or equal to 4.7 eV, greater than or equal to 4.8 eV, greater than or equal to 4.9 eV, greater than or equal to 5.0 eV, greater than or equal to 5.1 eV, or greater than or equal to 5.2 eV. In one or more embodiments, the work-function material 114 comprises a metal nitride. In one more embodiments, the work-function material 114 comprises one or more of titanium nitride (TiN), tungsten nitride (WN), tantalum nitride (TaN), molybdenum nitride (MoN), TaN/TiN, or WN/TiN.

The substrate 102 has a source/drain region 117 adjacent the first side 106 and the second side 108 of the at least one gate stack 104. In one or more embodiments, the source/drain region 117 comprises a source 116 and a drain 118. While it is noted that, in this disclosure, the reference numeral 116 refers to the source and the reference numeral 118 refers to the drain, as recognized by one skilled in the art, the positioning of the source and drain materials can be switched such that 116 is the drain and 118 is the source.

The source 116 and drain 118 can be any suitable material known to the skilled artisan. In one or more embodiments, the source and drain materials 116/118 may have more than one layer. For example, the source and drain materials may comprise three layers. In one or more embodiments, the source/drain material 116/118 comprise one or more of copper (Cu), cobalt (Co), tungsten (W), titanium (Ti), molybdenum (Mo), nickel (Ni), ruthenium (Ru), silver (Ag), gold (Au), iridium (Ir), platinum (Pt), phosphorus (P), germanium (Ge), silicon (Si), aluminum (Al), or zirconium (Zr). In some embodiments, the source/drain materials 116/118 comprise a bottom layer of silicon with doped epi (e.g. SiGe, SiP, and the like), a second layer of silicide, which may contain nickel (Ni), titanium (Ti), aluminum (Al), and the like, and a third, or top, layer which may be a metal such as, but not limited to, cobalt, tungsten, ruthenium, and the like.

In some embodiments, the source/drain material 116/118 are raised source/drain (S/D) regions formed by EPI growth.

In one or more embodiments, a sacrificial material 112 is on the source/drain region 117. The sacrificial material 112 may comprise any suitable material known to one of skill in the art. For example, in one or more embodiments, the sacrificial material 112 comprises a suitable material that can be selectively etched for form a trench that will be filled with a suitable contact material.

Figure 2:
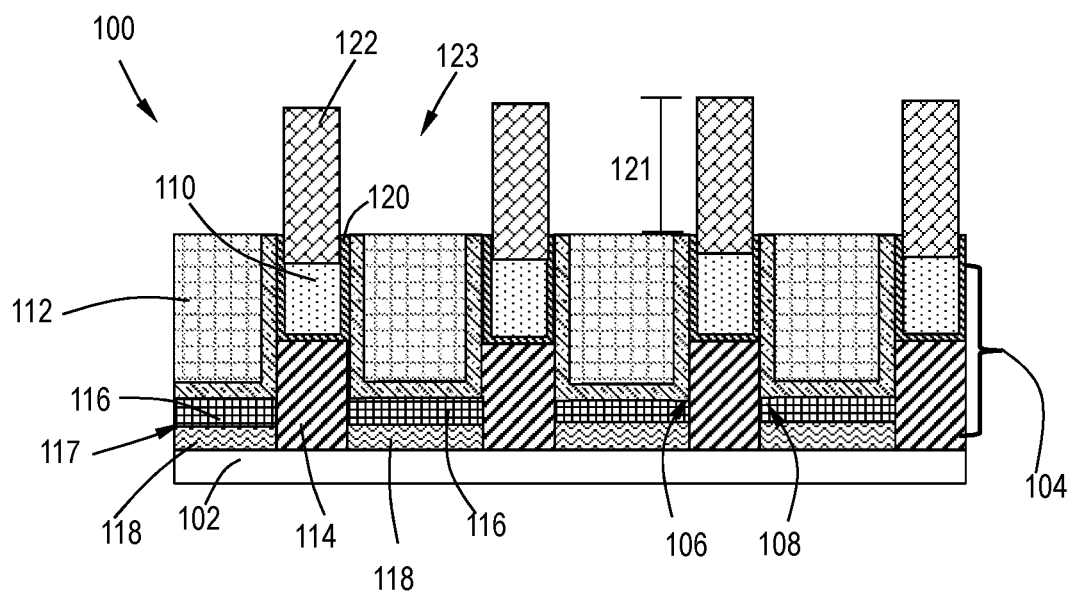
FIG. 2 illustrates a cross-section view of an electronic device according to one or more embodiments of the disclosure.

With reference to FIG. 2, a selective pillar growth technique is used to grow pillars 122 on the gate metal 110. In one or more embodiments, the gate metal 110 comprises a set of conductive lines (not illustrate) that extend along a first direction. Pillars 122 are formed on the gate metal 110. FIG. 2 illustrates pillars 122 being grown on an optional liner 120. In one or more embodiments, the optional liner 120 can be conformal liner 120. In one or more embodiments, the conformal liner 120 can be any suitable metal liner material known to the skilled artisan. In one or more embodiments, the conformal liner 120 comprises a metal nitride film. In some embodiments, the conformal liner 120 comprises one or more of tungsten nitride, tantalum nitride, or titanium nitride. In one or more embodiments, self-aligned selective growth pillars 122 are formed using a seed gapfill layer, optionally on the liner 122, on the recessed conductive lines of the gate metal 110.

As used herein, the term "self-aligned growth pillars" refers to columns of a metal that are used to form self-aligned vias. The self-aligned growth pillars have a height 121 of about 5 angstroms (Å) to about 10 microns (μm) that extends above the top surface of the electronic device 100. The width of the self-aligned growth pillars is in a range of about 0.5 nm to about 2000 nm. In one or more embodiments, when the self-aligned growth pillars 122 are removed, self-aligned vias 129 are formed. The self-aligned vias 129 have a minimum width that is equal to the width of the self-aligned growth pillars 122. In some embodiments, the width of the self-aligned vias 129 may be increased by trimming and/or removing the spacer material 124.

As shown in FIG. 2, the pillars 122 extend substantially orthogonally from the top surfaces of the gate metal 110. As shown in FIG. 2, the pillars 122 extend along the same direction as the conductive lines of the gate metal 110, and are separated by gaps 123.

In one or more embodiments, a seed gapfill layer (not illustrated) is deposited on the gate metal 110. In one embodiment, seed gapfill layer is a self-aligned selective growth seed film. In one or more embodiments, the seed gapfill layer is deposited on gate metal 110 on the top surface of the recessed conductive lines. In one or more embodiments, the seed gapfill layer is a tungsten (W) layer, or other seed gapfill layer to provide selective growth pillars. In some embodiments, the seed gapfill layer is a metal film or a metal containing film. Suitable metal films include, but are not limited to, films including one or more of cobalt (Co), molybdenum (Mo), tungsten (W), tantalum (Ta), titanium (Ti), ruthenium (Ru), rhodium (Rh), copper (Cu), iron (Fe), manganese (Mn), vanadium (V), niobium (Nb), hafnium (Hf), zirconium (Zr), yttrium (Y), aluminum (Al), tin (Sn), chromium (Cr), lanthanum (La), or any combination thereof. In some embodiments, the seed gapfill layer is a tungsten (W) seed gapfill layer.

In one or more embodiments, the seed gapfill layer is deposited using one or more deposition techniques, such as but not limited to ALD, CVD, PVD, MBE, MOCVD, spin-on or other deposition techniques known to one of ordinary skill in the art of microelectronic device manufacturing.

In one or more embodiments, portions of the seed gapfill layer above the gate metal 110 are expanded for example, by oxidation, nitridation, or other process to grow pillars 122. In one embodiment, the seed gap fill layer is oxidized by exposure to an oxidizing agent or oxidizing conditions to transform the metal or metal containing seed gapfill layer to metal oxide pillars 122. In one or more embodiments, pillars 122 include an oxide of one or more metals listed above. In more specific embodiment, pillars 122 include tungsten oxide (e.g., WO, $WO_3$ and other tungsten oxide).

The oxidizing agent can be any suitable oxidizing agent including, but not limited to, $O_2$, $O_3$, $N_2O$, $H_2O$, $H_2O_2$, CO, $CO_2$, $NH_3$, $N_2$/Ar, $N_2$/He, $N_2$/Ar/He or any combination thereof. In some embodiments, the oxidizing conditions comprise a thermal oxidation, plasma enhanced oxidation, remote plasma oxidation, microwave and radio-frequency oxidation (e.g., inductively coupled plasma (ICP), capacitively coupled plasma (CCP)).

In one or more embodiments, the pillars 122 are formed by oxidation of the seed gapfill layer at any suitable temperature depending on, for example, the composition of the seed gapfill layer and the oxidizing agent. In some embodiments, the oxidation occurs at a temperature in an approximate range of about 25° C. to about 800° C. In some embodiments, the oxidation occurs at a temperature greater than or equal to about 150° C.

In one embodiment, the height 121 of the pillars 122 is in an approximate range from about 5 angstroms (Å) to about 10 microns (μm).

Figure 3:
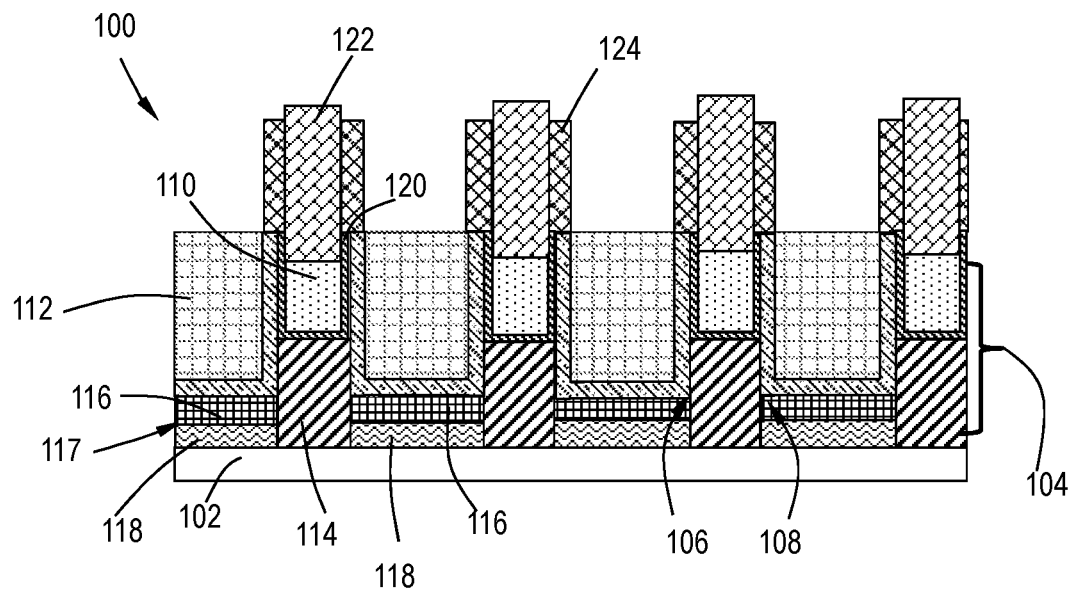
FIG. 3 illustrates a cross-section view of an electronic device according to one or more embodiments of the disclosure.

With reference to FIG. 3, after pillars 122 are form, a spacer material 124 is deposited. In one or more embodiments, the spacer material 124 is deposited using any suitable deposition technique known to one of skill in the art. In one or more embodiments, the formation of the spacer material 124 requires deposition following be selective etching.

In one or more embodiments, as illustrated in FIG. 3, a spacer material 124 is formed adjacent the first side 106 and the second side 108 of the pillars 122. The spacer material 124 on either side of the pillars 122 can be the same material or different materials. The spacer material 124 adjacent the first side 106 of the pillar 122 can be referred to as the first spacer material 124 and the spacer material 124 adjacent the second side 108 of the pillar 122 can be referred to as the second spacer material 124. The first spacer material 124 and the second spacer material 124 can be the same material or can be different materials. In one or more embodiments, the first spacer material 124 and the second spacer material 124 are the same material.

The spacer material 124 can be made of any suitable material known to the skilled artisan. The spacer material 124 of some embodiments comprises a low-K dielectric material. In some embodiments, spacer material 124 is selected from aluminum oxide (AlO), silicon carbonitride (SiCN), silicon oxycarbide (SiOC), or silicon oxycarbonitride (SiONC).

Figure 4:
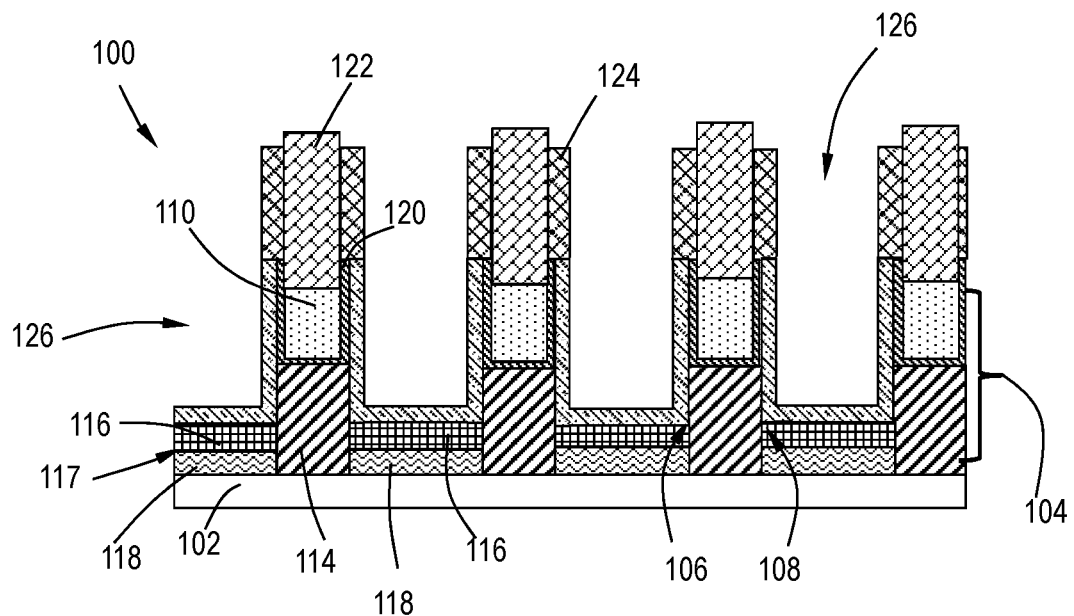
FIG. 4 illustrates a cross-section view of an electronic device according to one or more embodiments of the disclosure.

With reference to FIG. 4, sacrificial material 112 is removed to form an opening 126. The sacrificial material 112 may be removed by any suitable technique known to one of skill in the art, including, but not limited to, etching.

Figure 5:
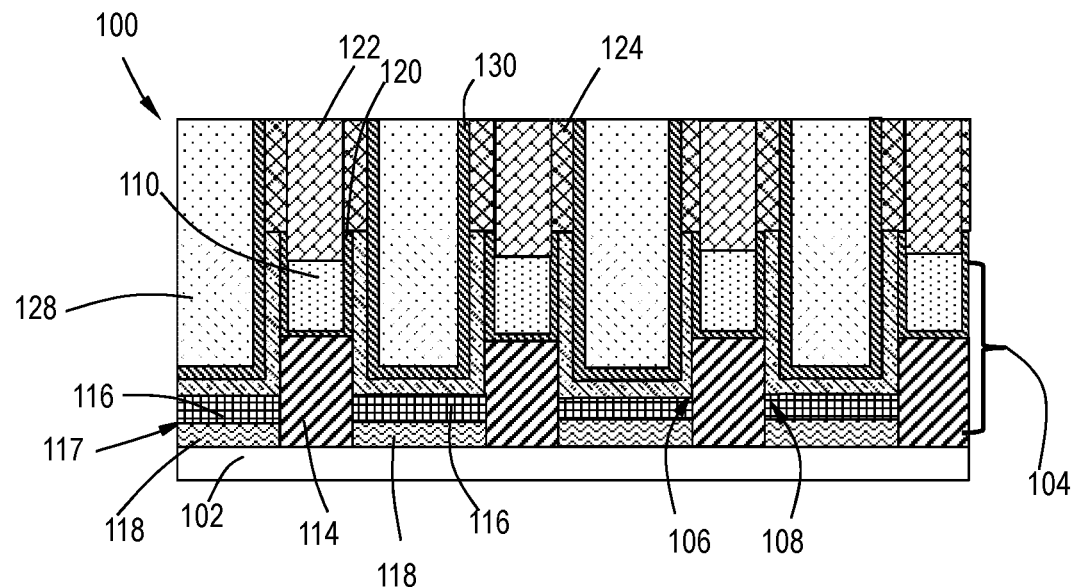
FIG. 5 illustrates a cross-section view of an electronic device according to one or more embodiments of the disclosure.

With reference to FIG. 5, a metal is deposited into opening 126 for form a source/drain contact 128. The metal may be deposited by any suitable deposition technique known to one of skill in the art including, but not limited to, ALD, CVD, PVD, MBE, MOCVD, spin-on or other deposition techniques known to one of ordinary skill in the art of microelectronic device manufacturing. In one or more embodiments, the source/drain contact 128 comprises one or more of nitrogen (N), copper (Cu), cobalt (Co), tungsten (W), titanium (Ti), molybdenum (Mo), nickel (Ni), ruthenium (Ru), silver (Ag), gold (Au), iridium (Ir), tantalum (Ta), or platinum (Pt).

In one or more embodiments, a conformal liner 130 may be deposited in opening 126 prior to deposition of a metal to form source/drain contact 128. The conformal liner 130 can be any suitable metal liner material known to the skilled artisan. In one or more embodiments, the conformal liner 130 comprises a metal nitride film. In some embodiments, the conformal liner 130 comprises one or more of tungsten nitride, tantalum nitride, or titanium nitride.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A, e.g. aluminum precursor) is pulsed into the reaction zone followed by a first time delay. Next, a second precursor or compound B (e.g. oxidant) is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

As used herein, "chemical vapor deposition" refers to a process in which a substrate surface is exposed to precursors and/or co-reagents simultaneous or substantially simultaneously. As used herein, "substantially simultaneously" refers to either co-flow or where there is overlap for a majority of exposures of the precursors.

Plasma enhanced chemical vapor deposition (PECVD) is widely used to deposit thin films due to cost efficiency and film property versatility. In a PECVD process, for example, a hydrocarbon source, such as a gas-phase hydrocarbon or a vapor of a liquid-phase hydrocarbon that have been entrained in a carrier gas, is introduced into a PECVD chamber. A plasma-initiated gas, typically helium, is also introduced into the chamber. Plasma is then initiated in the chamber to create excited CH-radicals. The excited CH-radicals are chemically bound to the surface of a substrate positioned in the chamber, forming the desired film thereon. Embodiments described herein in reference to a PECVD process can be carried out using any suitable thin film deposition system. Any apparatus description described herein is illustrative and should not be construed or interpreted as limiting the scope of the embodiments described herein.

Figure 6:
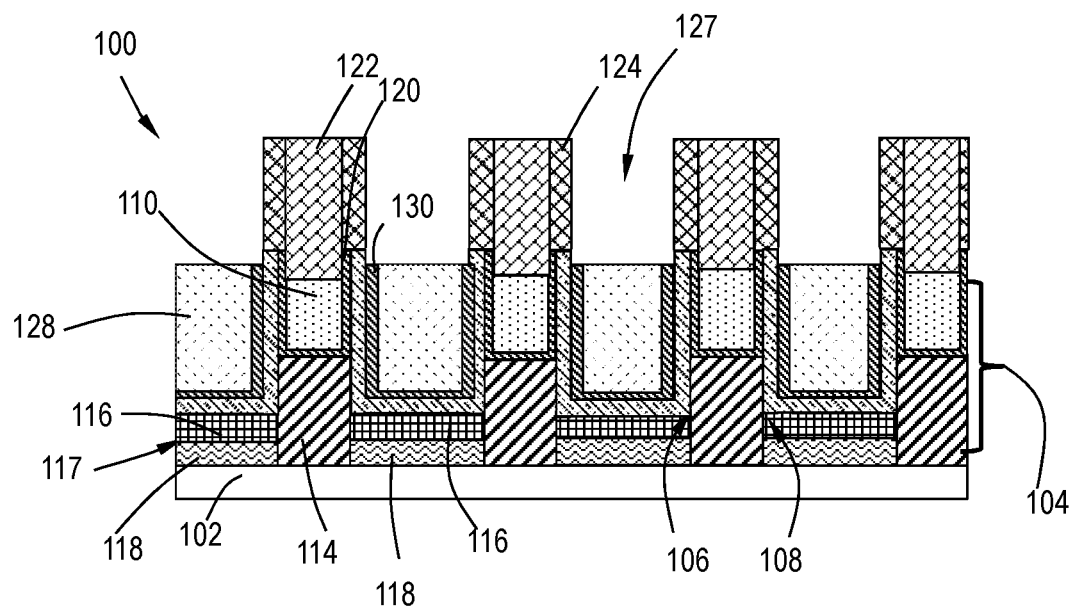
FIG. 6 illustrates a cross-section view of an electronic device according to one or more embodiments of the disclosure.

With reference to FIG. 6, in one or more embodiments, the source/drain contact 128 and the optional conformal liner 130 are recessed to form gaps 127 between the pillars 122 and spacer material 124. In one or more embodiments, the recessing of the source/drain contact can be conducted by any technique known to one of skill in the art including, but not limited to, selective etching.

Figure 7:
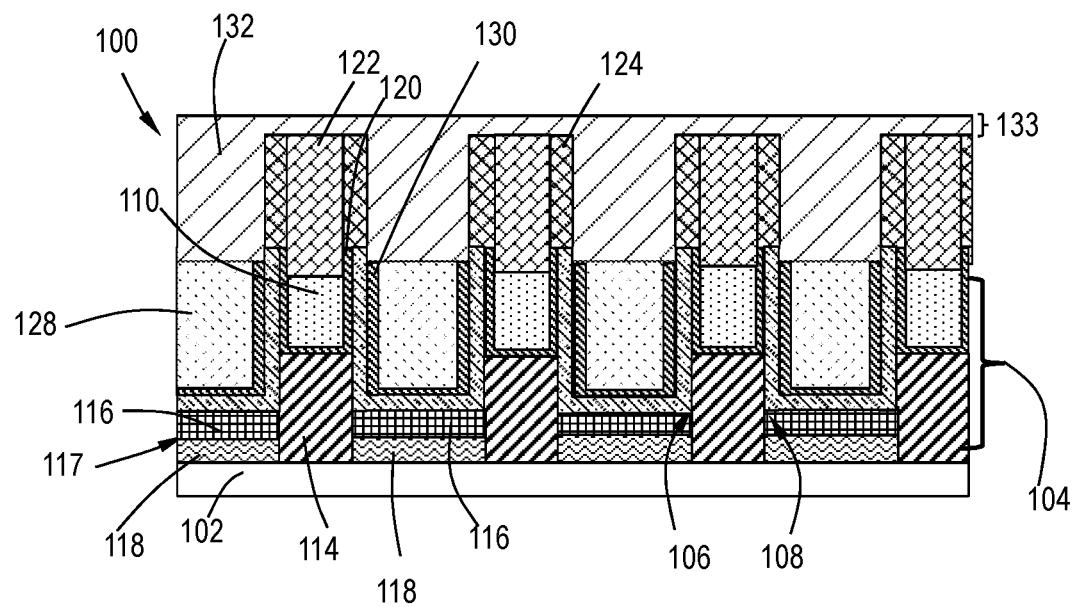
FIG. 7 illustrates a cross-section view of an electronic device according to one or more embodiments of the disclosure.
Figure 8:
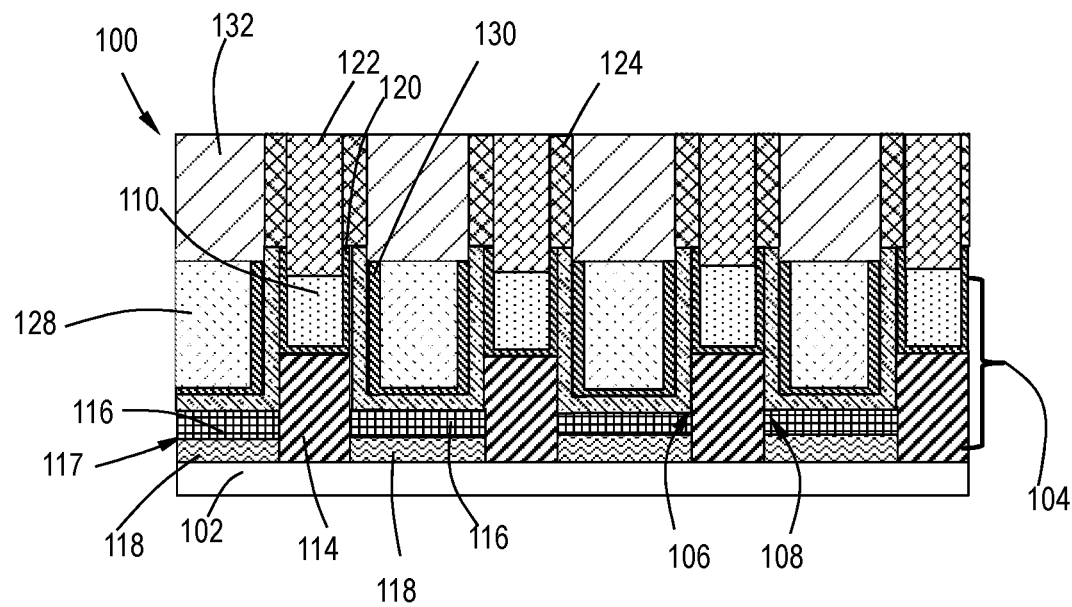
FIG. 8 illustrates a cross-section view of an electronic device according to one or more embodiments of the disclosure.

Referring to FIG. 7, in one or more embodiments, a dielectric material 132 is deposited in gaps 127 and on the top surface of the pillars 122, the source material 124, and the source/drain contact 128, and optional conformal liner 130. The dielectric material 124 may be any suitable material known to one of skill in the art. In one or more embodiments, the dielectric material 132 comprise one or more of silicon carbide (SiC), silicon nitride (SiN), tungsten carbide (WC), or tungsten oxide (WO). As illustrated in FIG. 7, in one or more embodiments, an overburden 133 of the dielectric material 132 is formed. With reference to FIG. 8, the overburden 133 is removed by any suitable technique known to one of skill in the art including, but not limited to, chemical mechanical planarization (CMP). In one or more embodiments, when the overburden 133 of the dielectric material 132 is removed, the dielectric material 132 is substantially coplanar with the top surface of the pillars 122 and the spacer material 124.

Figure 9:
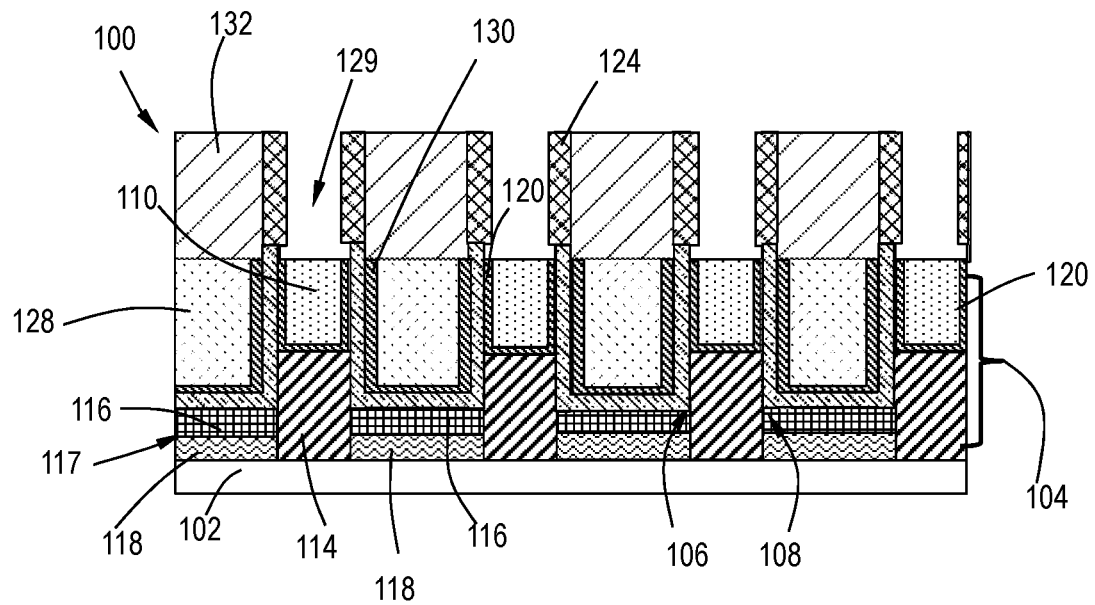
FIG. 9 illustrates a cross-section view of an electronic device according to one or more embodiments of the disclosure.

Referring to FIG. 9, in one or more embodiments, the self-aligned selectively grown pillars 122 are selectively removed to form trenches 129. As shown in FIG. 9, the pillars 122 are removed selectively to the gate metal 110 and the optional conformal liner 120. In another embodiment, when liner 120 is a non-conductive liner, liner 120 is removed. In one embodiment, the pillars 122 and liner 120 are removed selectively to the gate metal 110. As shown in FIG. 9, trenches 129 are formed in the dielectric material 132. As illustrated in FIG. 9, each trench 129 has a bottom that is a top surface of the gate metal 110 and the optional liner 130 and opposing sidewalls that include a sidewall portion of spacer material 124. In another embodiment, when liner 120 is removed, each trench 129 has a bottom that is a top surface of gate metal 110 and opposing sidewalls that include portions of spacer material 124. Generally, the aspect ratio of the trench 129 refers to the ratio of the depth of the trench to the width of the trench. In one embodiment, the aspect ratio of each trench 129 is in an approximate range from about 1:1 to about 200:1.

In one embodiment, the pillars 122 are selectively removed using one or more of the dry and wet etching techniques known to one of ordinary skill in the art of electronic device manufacturing. In one embodiment, the pillars 122 are selectively wet etched by e.g., 5 wt % of ammonium hydroxide ($NH_4OH$) aqueous solution at the temperature of about 80 degrees C. In one embodiment, hydrogen peroxide ($H_2O_2$) is added to the 5 wt % $NH_4OH$ aqueous solution to increase the etching rate of the pillars 122. In one embodiment, the pillars 122 are selectively wet etched using hydrofluoric acid (HF) and nitric acid ($HNO_3$) in a ratio of 1:1. In one embodiment, the pillars 122 are selectively wet etched using HF and $HNO_3$ in a ratio of 3:7 respectively. In one embodiment, the pillars 122 are selectively wet etched using HF and $HNO_3$ in a ratio of 4:1, respectively. In one embodiment, the pillars 122 are selectively wet etched using HF and $HNO_3$ in a ratio of 30%: 70%, respectively. In one embodiment, the pillars 122 including tungsten, titanium or both titanium and tungsten are selectively wet etched using $NH_4OH$ and $H_2O_2$ in a ratio of 1:2, respectively. In one embodiment, the pillars 122 are selectively wet etched using 305 grams of potassium ferricyanide ($K_3Fe(CN)_6$), 44.5 grams of sodium hydroxide (NaOH) and 1000 ml of water ($H_2O$). In one embodiment, the pillars 122 are selectively wet etched using diluted or concentrated one or more of the chemistries including hydrochloric acid (HCl), $HNO_3$, sulfuric acid ($H_2SO_4$), HF, and $H_2O_2$. In one embodiment, the pillars 122 are selectively wet etched using HF, $HNO_3$ and acetic acid (HAc) in a ratio of 4:4:3, respectively. In one embodiment, the pillars 122 are selectively dry etched using a bromotrifluoromethane (CBrF3) reactive ion etching (RIE) technique. In one embodiment, the pillars 122 are selectively dry etched using chlorine, fluorine, bromine or any combination thereof based chemistries. In one embodiment, the pillars 122 are selectively wet etched using hot or warm Aqua Regia mixture including HCl and $HNO_3$ in a ratio of 3:1, respectively. In one embodiment, the pillars 122 are selectively etched using alkali with oxidizers (potassium nitrate ($KNO_3$) and lead dioxide ($PbO_2$)). In one embodiment, the liner 120 is selectively removed using one or more of the dry and wet etching techniques known to one of ordinary skill in the art of electronic device manufacturing.

Figure 10:
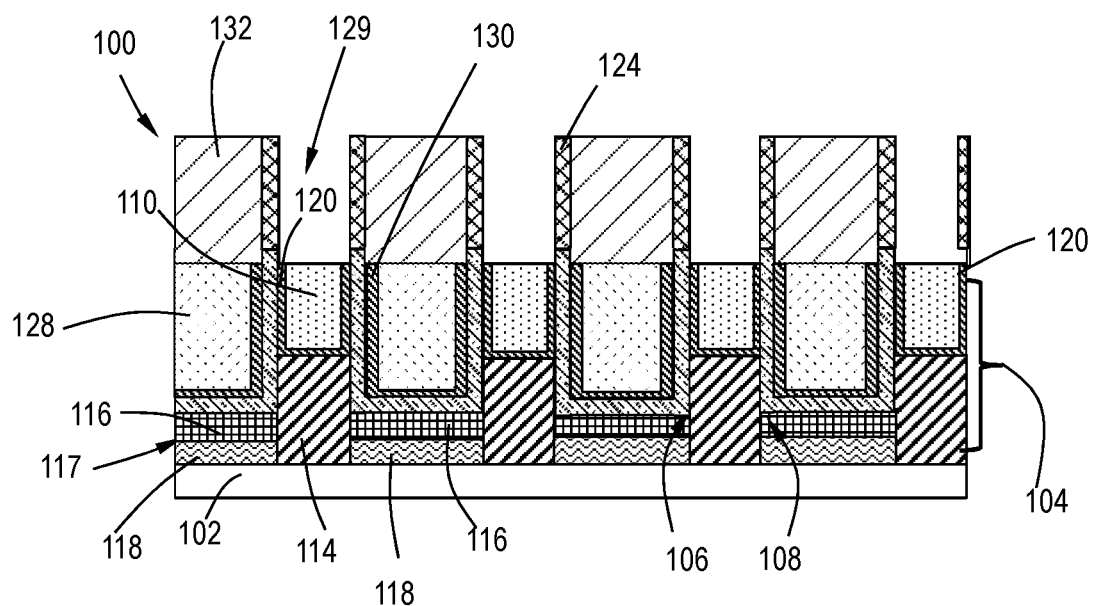
FIG. 10 illustrates a cross-section view of an electronic device according to one or more embodiments of the disclosure.

Referring to FIG. 10, in one or more embodiments, after the pillars 122 are selectively removed, the spacer material 124 is trimmed or etched such that a sidewall of the trench 129 comprises spacer material 124 that is substantially coplanar.

Figure 11:
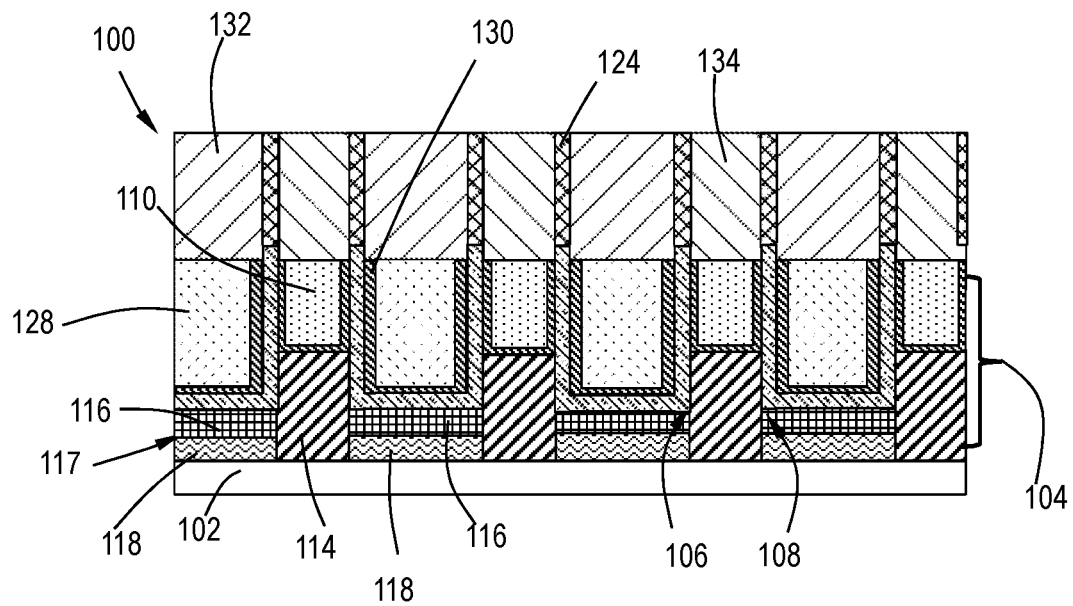
FIG. 11 illustrates a cross-section view of an electronic device according to one or more embodiments of the disclosure.

As illustrated in FIG. 11, the trench 129 is then filled with a second dielectric material 134. The dielectric material 134 may be any suitable material known to one of skill in the art. In one or more embodiments, the dielectric material 133 comprises one or more of silicon carbide (SiC), silicon nitride (SiN), tungsten carbide (WC), or tungsten oxide (WO). In a specific embodiment, the dielectric material 134 comprises SiN. In one or more embodiments, an overburden (not illustrated) of the dielectric material 134 is formed. In one or more embodiments, the overburden (not illustrated) may be removed by any suitable technique known to one of skill in the art including, but not limited to, chemical mechanical planarization (CMP). In one or more embodiments, when the overburden (not illustrated) of the dielectric material 134 is removed, the dielectric material 134 is substantially coplanar with the top surface of the dielectric material 132 and the spacer material 124.

One or more embodiments are directed to an electronic device. With reference to FIG. 11, in one or more embodiments, an electronic device 100 comprises a substrate 102 having an active region with at least one gate stack 104 formed thereon, the at least one gate stack 104 having a first side 106 and a second side 108 and comprising a source/drain 116/118 and a gate metal 110. A source/drain contact 128 is on the source/drain 116/118. A first dielectric material 132 is on the contact 128. A spacer material 124 is adjacent the first side 106 and the second side 108 of the at least one gate stack 104, and a second dielectric material 134 is on the at least one gate stack 104. The gate metal 110 has a thickness in a range of about 0.5 nm to about 2000 nm and the second dielectric 134 has a thickness in a range of about 0.5 nm to about 2000 nm. In one or more embodiments, the gate metal 110 has a thickness in a range of about 0.5 nm to about 2000 nm, including about 0.5 nm to about 1500 nm, about 0.5 nm to about 1000 nm, about 0.5 nm to about 500 nm, and about 0.5 nm to about 250 nm. In one or more embodiments, the second dielectric 134 has a thickness in a range of about 0.5 nm to about 2000 nm, including about 0.5 nm to about 1500 nm, about 0.5 nm to about 1000 nm, about 0.5 nm to about 500 nm, and about 0.5 nm to about 250 nm. Without intending to be bound by theory, it Is thought that the thickness (or height) of the dielectric material 134 advantageously increases the margin against shorting defects. Additionally, it is thought that dielectric material 134 advantageously provides extra etch selectivity such that the margin against shorting for is increased further.

Figure 12:
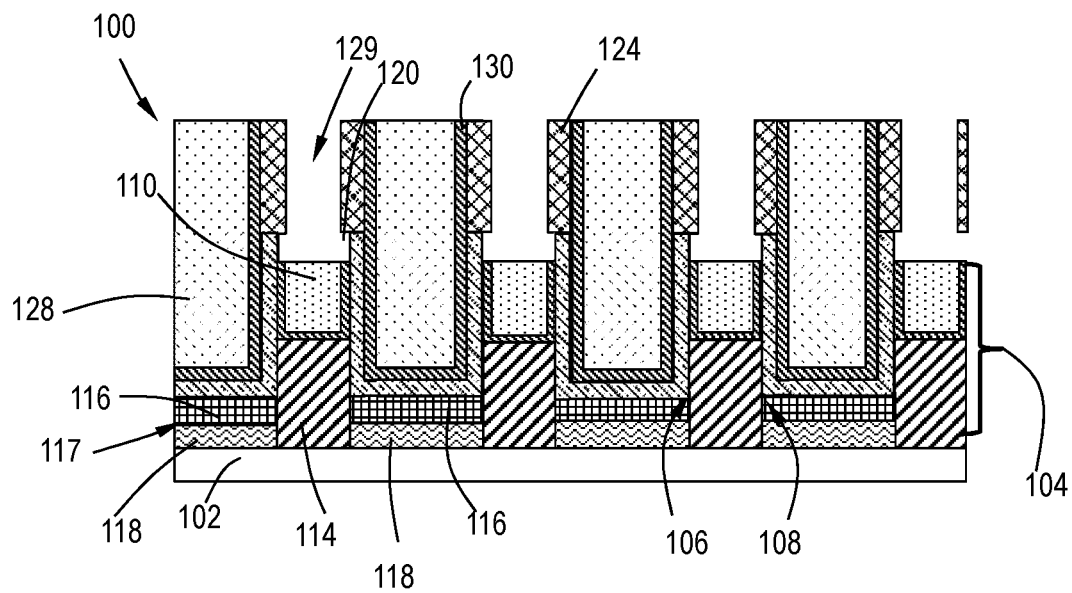
FIG. 12 illustrates a cross-section view of an electronic device according to one or more alternative embodiments of the disclosure.

FIGS. 12-15 refer to alternative embodiments of the invention. In FIG. 12, the electronic device of FIG. 5 is further processed. In FIG. 12, the self-aligned selectively grown pillars 122 are selectively removed to form trenches 129. As shown in FIG. 12, the pillars 122 are removed selectively to the gate metal 110 and the optional conformal liner 120. In another embodiment, when liner 120 is a non-conductive liner, liner 120 is removed. In one embodiment, the pillars 122 and liner 120 are removed selectively to the gate metal 110. As shown in FIG. 12, trenches 129 are formed in the dielectric material 132. As illustrated in FIG. 12, each trench 129 has a bottom that is a top surface of the gate metal 110 and the optional liner 130 and opposing sidewalls that include a sidewall portion of spacer material 124. In another embodiment, when liner 120 is removed, each trench 129 has a bottom that is a top surface of gate metal 110 and opposing sidewalls that include portions of spacer material 124. Generally, the aspect ratio of the trench 129 refers to the ratio of the depth of the trench to the width of the trench. In one embodiment, the aspect ratio of each trench 129 is in an approximate range from about 1:1 to about 200:1.

In one embodiment, the pillars 122 are selectively removed using one or more of the dry and wet etching techniques known to one of ordinary skill in the art of electronic device manufacturing. In one embodiment, the pillars 122 are selectively wet etched by e.g., 5 wt % of ammonium hydroxide ($NH_4OH$) aqueous solution at the temperature of about 80 degrees C. In one embodiment, hydrogen peroxide ($H_2O_2$) is added to the 5 wt % $NH_4OH$ aqueous solution to increase the etching rate of the pillars 122. In one embodiment, the pillars 122 are selectively wet etched using hydrofluoric acid (HF) and nitric acid ($HNO_3$) in a ratio of 1:1. In one embodiment, the pillars 122 are selectively wet etched using HF and $HNO_3$ in a ratio of 3:7 respectively. In one embodiment, the pillars 122 are selectively wet etched using HF and $HNO_3$ in a ratio of 4:1, respectively. In one embodiment, the pillars 122 are selectively wet etched using HF and $HNO_3$ in a ratio of 30%:70%, respectively. In one embodiment, the pillars 122 including tungsten, titanium or both titanium and tungsten are selectively wet etched using $NH_4OH$ and $H_2O_2$ in a ratio of 1:2, respectively. In one embodiment, the pillars 122 are selectively wet etched using 305 grams of potassium ferricyanide ($K_3Fe(CN)_6$), 44.5 grams of sodium hydroxide (NaOH) and 1000 ml of water ($H_2O$). In one embodiment, the pillars 122 are selectively wet etched using diluted or concentrated one or more of the chemistries including hydrochloric acid (HCl), $HNO_3$, sulfuric acid ($H_2SO_4$), HF, and $H_2O_2$. In one embodiment, the pillars 122 are selectively wet etched using HF, $HNO_3$ and acetic acid (HAc) in a ratio of 4:4:3, respectively. In one embodiment, the pillars 122 are selectively dry etched using a bromotrifluoromethane (CBrF3) reactive ion etching (RIE) technique. In one embodiment, the pillars 122 are selectively dry etched using chlorine, fluorine, bromine or any combination thereof based chemistries. In one embodiment, the pillars 122 are selectively wet etched using hot or warm Aqua Regia mixture including HCl and $HNO_3$ in a ratio of 3:1, respectively. In one embodiment, the pillars 122 are selectively etched using alkali with oxidizers (potassium nitrate ($KNO_3$) and lead dioxide ($PbO_2$)). In one embodiment, the liner 120 is selectively removed using one or more of the dry and wet etching techniques known to one of ordinary skill in the art of electronic device manufacturing.

Figure 13:
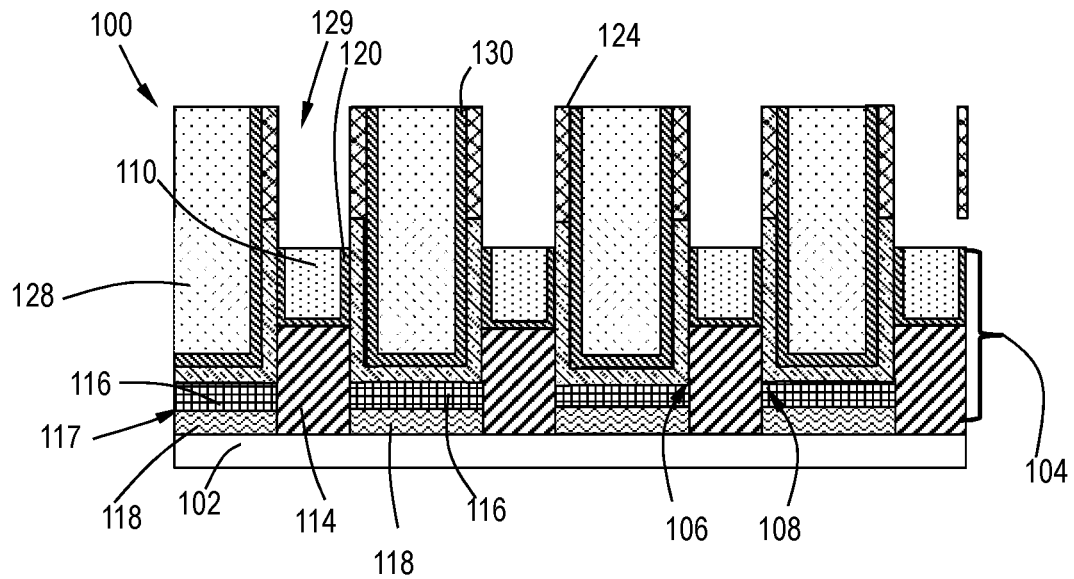
FIG. 13 illustrates a cross-section view of an electronic device according to one or more alternative embodiments of the disclosure.

Referring to FIG. 13, in one or more embodiments, after the pillars 122 are selectively removed, the spacer material 124 is trimmed or etched such that a sidewall of the trench 129 comprises spacer material 124 that is substantially coplanar.

Figure 14:
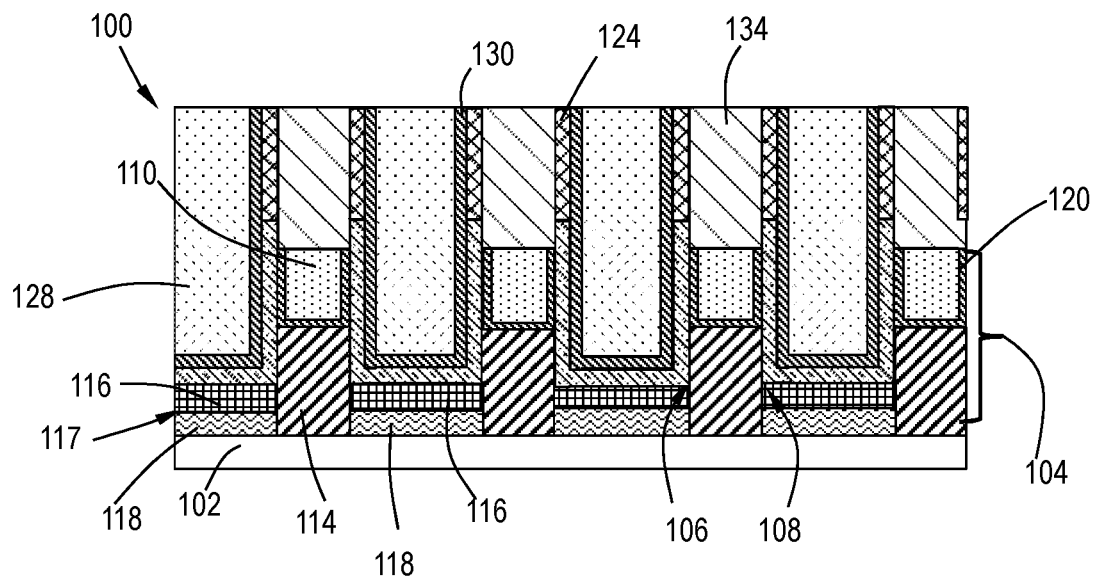
FIG. 14 illustrates a cross-section view of an electronic device according to one or more alternative embodiments of the disclosure.

As illustrated in FIG. 14, in one or more embodiments, the trench 129 is then filled with a dielectric material 134. The dielectric material 134 may be any suitable material known to one of skill in the art. In one or more embodiments, the dielectric material 133 comprises one or more of silicon carbide (SiC), silicon nitride (SiN), tungsten carbide (WC), or tungsten oxide (WO). In a specific embodiment, the dielectric material 134 comprises SiN. In one or more embodiments, the dielectric material 134 has a thickness in a range of about 0.5 nm to about 2000 nm. In one or more embodiments, an overburden (not illustrated) of the dielectric material 134 is formed. In one or more embodiments, the overburden (not illustrated) may be removed by any suitable technique known to one of skill in the art including, but not limited to, chemical mechanical planarization (CMP). In one or more embodiments, when the overburden (not illustrated) of the dielectric material 134 is removed, the dielectric material 134 is substantially coplanar with the top surface of the source/drain contact 128, the optional conformal liner 130, and the spacer material 124.

Figure 15:
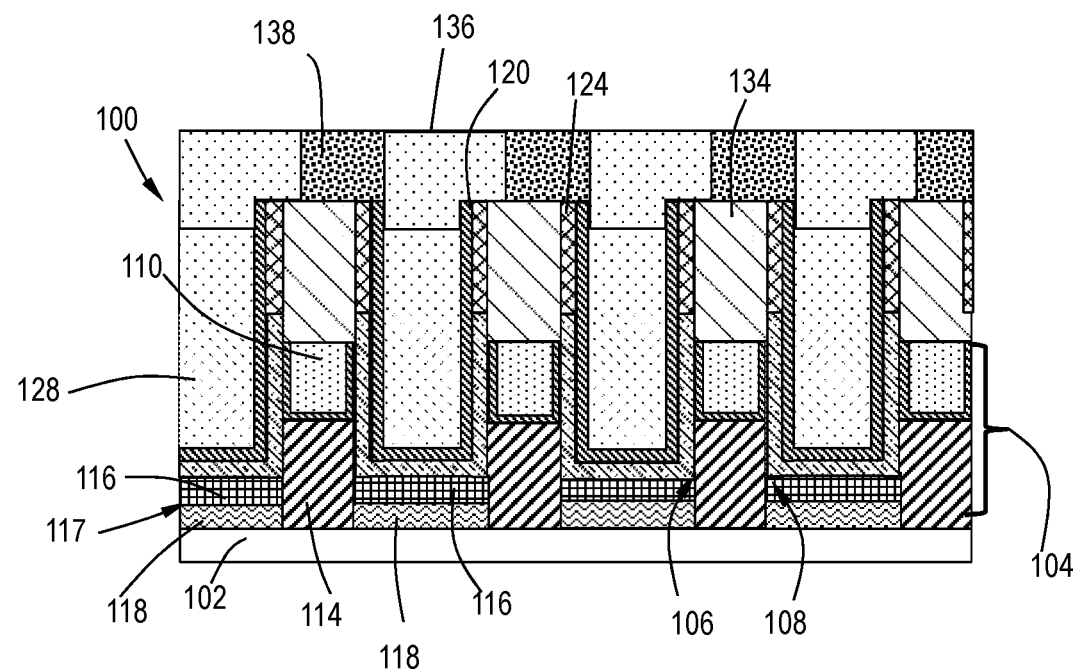
FIG. 15 illustrates a cross-section view of an electronic device according to one or more alternative embodiments of the disclosure.

Referring to FIG. 15, the electronic device of FIG. 14 is further processed by formation of a next layer. A contact 136 is deposited on the top surface of source/drain contact 128. The contact 136 may be deposited by any deposition technique known to one of skill in the art. Without intending to be bound by theory, the thickness of the dielectric material 134 advantageously increases the margin against shorting for contact 136. Additionally, it is thought that dielectric material 134 advantageously provides extra etch selectivity such that the margin against shorting for contact 136 is increased further.

One or more embodiments are directed to an electronic device. With reference to FIG. 15, in one or more embodiments, an electronic device 100 comprises a substrate 102 having an active region with at least one gate stack 104 formed thereon, the at least one gate stack 104 having a first side 106 and a second side 108 and comprising a source/drain 116/118 and a gate metal 110. A source/drain contact 128 is on the source/drain 116/118. A spacer material 124 is adjacent the first side 106 and the second side 108 of the at least one gate stack 104, and a dielectric material 134 is on the at least one gate stack 104. The gate metal 110 has a thickness in a range of about 0.5 nm to about 2000 nm and the dielectric 134 has a thickness in a range of about 0.5 nm to about 2000 nm. A contact 136 is on the source/drain contact 128. Without intending to be bound by theory, the thickness of the dielectric material 134 advantageously increases the margin against shorting for contact 136. Additionally, it is thought that dielectric material 134 advantageously provides extra etch selectivity such that the margin against shorting for contact 136 is increased further.

Figure 16:
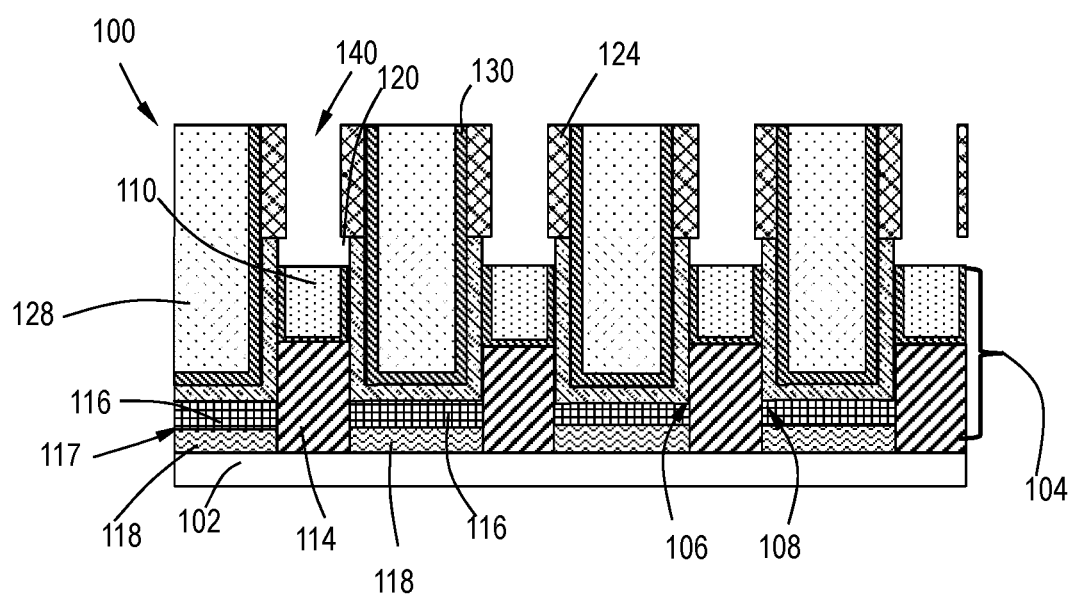
FIG. 16 illustrates a cross-section view of an electronic device according to one or more alternative embodiments of the disclosure.

FIGS. 16-19 refer to alternative embodiments of the invention. In FIG. 16, the electronic device of FIG. 5 is further processed. In FIG. 16, the self-aligned selectively grown pillars 122 are selectively removed to form trenches 129. As shown in FIG. 16, the pillars 122 are removed selectively to the gate metal 110 and the optional conformal liner 120. In another embodiment, when liner 120 is a non-conductive liner, liner 120 is removed. In one embodiment, the pillars 122 and liner 120 are removed selectively to the gate metal 110. As shown in FIG. 16, trenches 129 are formed in the dielectric material 132. As illustrated in FIG. 16, each trench 129 has a bottom that is a top surface of the gate metal 110 and the optional liner 130 and opposing sidewalls that include a sidewall portion of spacer material 124. In another embodiment, when liner 120 is removed, each trench 129 has a bottom that is a top surface of gate metal 110 and opposing sidewalls that include portions of spacer material 124. Generally, the aspect ratio of the trench 129 refers to the ratio of the depth of the trench to the width of the trench. In one embodiment, the aspect ratio of each trench 129 is in an approximate range from about 1:1 to about 200:1.

In one embodiment, the pillars 122 are selectively removed using one or more of the dry and wet etching techniques known to one of ordinary skill in the art of electronic device manufacturing. In one embodiment, the pillars 122 are selectively wet etched by e.g., 5 wt % of ammonium hydroxide ($NH_4OH$) aqueous solution at the temperature of about 80 degrees C. In one embodiment, hydrogen peroxide ($H_2O_2$) is added to the 5 wt % $NH_4OH$ aqueous solution to increase the etching rate of the pillars 122. In one embodiment, the pillars 122 are selectively wet etched using hydrofluoric acid (HF) and nitric acid ($HNO_3$) in a ratio of 1:1. In one embodiment, the pillars 122 are selectively wet etched using HF and $HNO_3$ in a ratio of 3:7 respectively. In one embodiment, the pillars 122 are selectively wet etched using HF and $HNO_3$ in a ratio of 4:1, respectively. In one embodiment, the pillars 122 are selectively wet etched using HF and $HNO_3$ in a ratio of 30%:70%, respectively. In one embodiment, the pillars 122 including tungsten, titanium or both titanium and tungsten are selectively wet etched using $NH_4OH$ and $H_2O_2$ in a ratio of 1:2, respectively. In one embodiment, the pillars 122 are selectively wet etched using 305 grams of potassium ferricyanide ($K_3Fe(CN)_6$), 44.5 grams of sodium hydroxide (NaOH) and 1000 ml of water ($H_2O$). In one embodiment, the pillars 122 are selectively wet etched using diluted or concentrated one or more of the chemistries including hydrochloric acid (HCl), $HNO_3$, sulfuric acid ($H_2SO_4$), HF, and $H_2O_2$. In one embodiment, the pillars 122 are selectively wet etched using HF, $HNO_3$ and acetic acid (HAc) in a ratio of 4:4:3, respectively. In one embodiment, the pillars 122 are selectively dry etched using a bromotrifluoromethane (CBrF3) reactive ion etching (RIE) technique. In one embodiment, the pillars 122 are selectively dry etched using chlorine, fluorine, bromine or any combination thereof based chemistries. In one embodiment, the pillars 122 are selectively wet etched using hot or warm Aqua Regia mixture including HCl and $HNO_3$ in a ratio of 3:1, respectively. In one embodiment, the pillars 122 are selectively etched using alkali with oxidizers (potassium nitrate ($KNO_3$) and lead dioxide ($PbO_2$)). In one embodiment, the liner 120 is selectively removed using one or more of the dry and wet etching techniques known to one of ordinary skill in the art of electronic device manufacturing.

Figure 17:
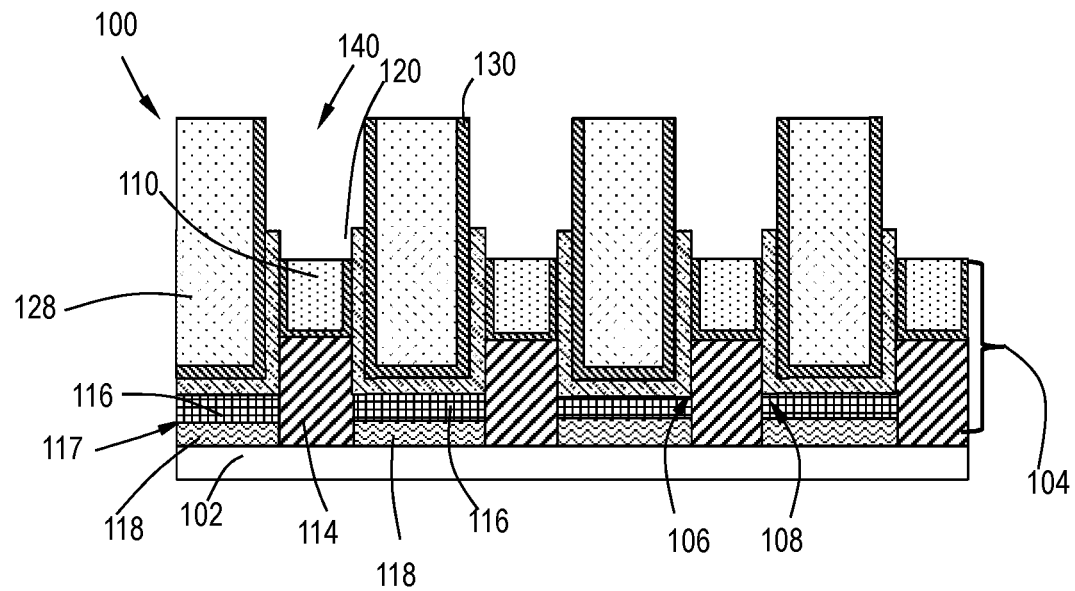
FIG. 17 illustrates a cross-section view of an electronic device according to one or more alternative embodiments of the disclosure.

Referring to FIG. 17, in one or more embodiments, after the pillars 122 are selectively removed, the spacer material 124 is removed such that a sidewall of the trench 129 comprises source/drain contact 128 or optional conformal liner 130. The spacer material 124 may be removed by any technique to known one of skill in the art that is selective to the source/drain contact 128 and the optional conformal liner 130.

Figure 18:
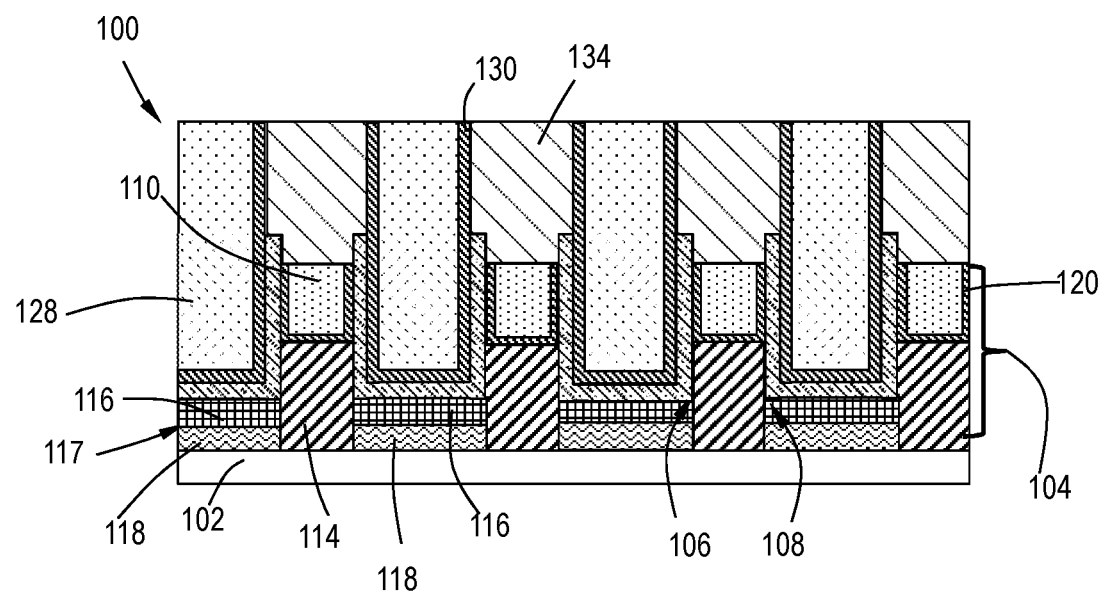
FIG. 18 illustrates a cross-section view of an electronic device according to one or more alternative embodiments of the disclosure.

As illustrated in FIG. 18, in one or more embodiments, the trench 129 is then filled with a dielectric material 134. The dielectric material 134 may be any suitable material known to one of skill in the art. In one or more embodiments, the dielectric material 134 comprises one or more of silicon carbide (SiC), silicon nitride (SiN), tungsten carbide (WC), or tungsten oxide (WO). In a specific embodiment, the dielectric material 134 comprises SiN. In one or more embodiments, an overburden (not illustrated) of the dielectric material 134 is formed. In one or more embodiments, the overburden (not illustrated) may be removed by any suitable technique known to one of skill in the art including, but not limited to, chemical mechanical planarization (CMP). In one or more embodiments, when the overburden (not illustrated) of the dielectric material 134 is removed, the dielectric material 134 is substantially coplanar with the top surface of the source/drain contact 128, the optional conformal liner 130, and the spacer material 124. In one or more embodiments, the dielectric material 134 has a thickness in a range of about 0.5 nm to about 2000 nm.

Figure 19:
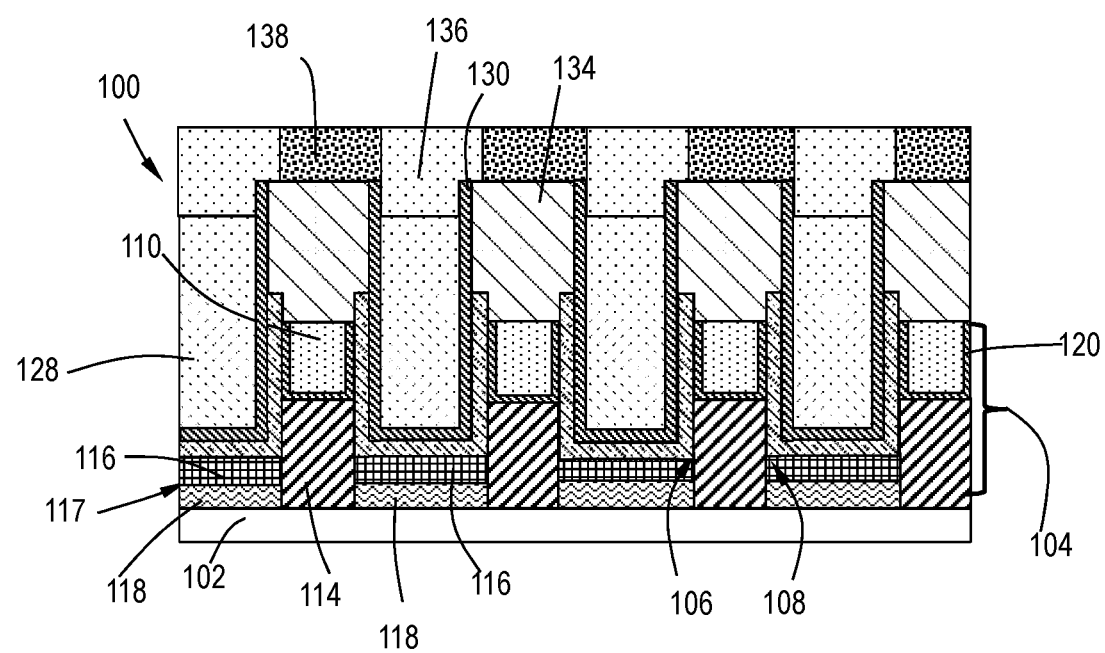
FIG. 19 illustrates a cross-section view of an electronic device according to one or more alternative embodiments of the disclosure.

Referring to FIG. 19, the electronic device of FIG. 18 is further processed by formation of a next layer. A contact 136 is deposited on the top surface of source/drain contact 128. The contact 136 may be deposited by any deposition technique known to one of skill in the art. Without intending to be bound by theory, the thickness of the dielectric material 134 advantageously increases the margin against shorting for contact 136. Additionally, it is thought that dielectric material 134 advantageously provides extra etch selectivity such that the margin against shorting for contact 136 is increased further.

One or more embodiments are directed to an electronic device. With reference to FIG. 19, in one or more embodiments, an electronic device 100 comprises a substrate 102 having an active region with at least one gate stack 104 formed thereon, the at least one gate stack 104 having a first side 106 and a second side 108 and comprising a source/drain 116/118 and a gate metal 110. A source/drain contact 128 is on the source/drain 116/118. A dielectric material 134 is on the at least one gate stack 104. The gate metal 110 has a thickness in a range of about 0.5 nm to about 2000 nm and the dielectric 134 has a thickness in a range of about 0.5 nm to about 2000 nm. A contact 136 is on the source/drain contact 128. Without intending to be bound by theory, the thickness of the dielectric material 134 advantageously increases the margin against shorting for contact 136. Additionally, it is thought that dielectric material 134 advantageously provides extra etch selectivity such that the margin against shorting for contact 136 is increased further.

Figure 20:
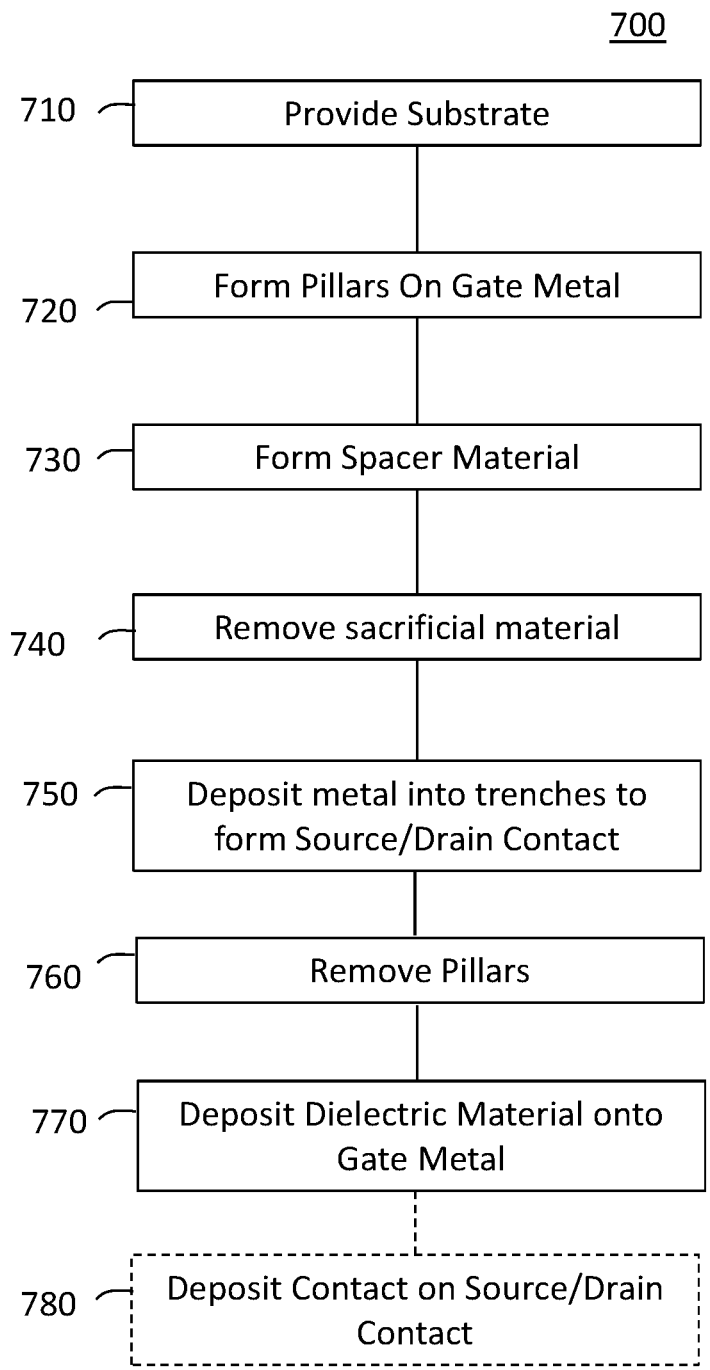
FIG. 20 depicts a flow process diagram of one embodiment of a method of forming a thin film according to embodiments described herein.

FIG. 20 depicts a flow diagram of a method 700 of manufacturing an electronic device. With respect to FIG. 20, the method 700 begins at operation 710, wherein a substrate having an active region with at least one gate stack formed thereon, the at least one gate stack having a first side and a second side and comprising a gate metal having a thickness in a range of about 0.5 nm to about 2000 nm, a source/drain on the substrate, and a sacrificial material on the source/drain is provided. In some embodiments, a conformal gate liner surrounds the gate metal. At operation 720, pillars are formed on the gate metal. In one or more embodiments, the method further comprises selectively growing a seed layer on the gate metal, such that the pillars are formed on the seed layer. At operation 730, a spacer material is formed on the first side and second side of the pillars. At operation 740, the sacrificial material is removed to form an opening to the source/drain. At operation 750, a metal is deposited in the opening to form a source/drain contact. At operation 760, the pillars are removed to form trenches, and, at operation 770, a dielectric material is deposited through the trenches onto the gate metal. In one or more embodiments, prior to depositing the dielectric material through the trenches, the spacer material is removed. At operation 780, the method further comprises depositing a contact on the source/drain contact.

In one or more embodiments, the method further comprises recessing the source/drain contact to form gaps between the pillars, followed by depositing a second dielectric material into the gaps. In other embodiments, the method further comprises, prior to depositing a metal, depositing a liner material (e.g. a conformal liner) into the trenches to form a conformal liner around the source/drain contact.

In still further embodiments, the method further comprises, prior to depositing the dielectric material, removing the conformal gate liner and etching the spacer material.

Figure 21:
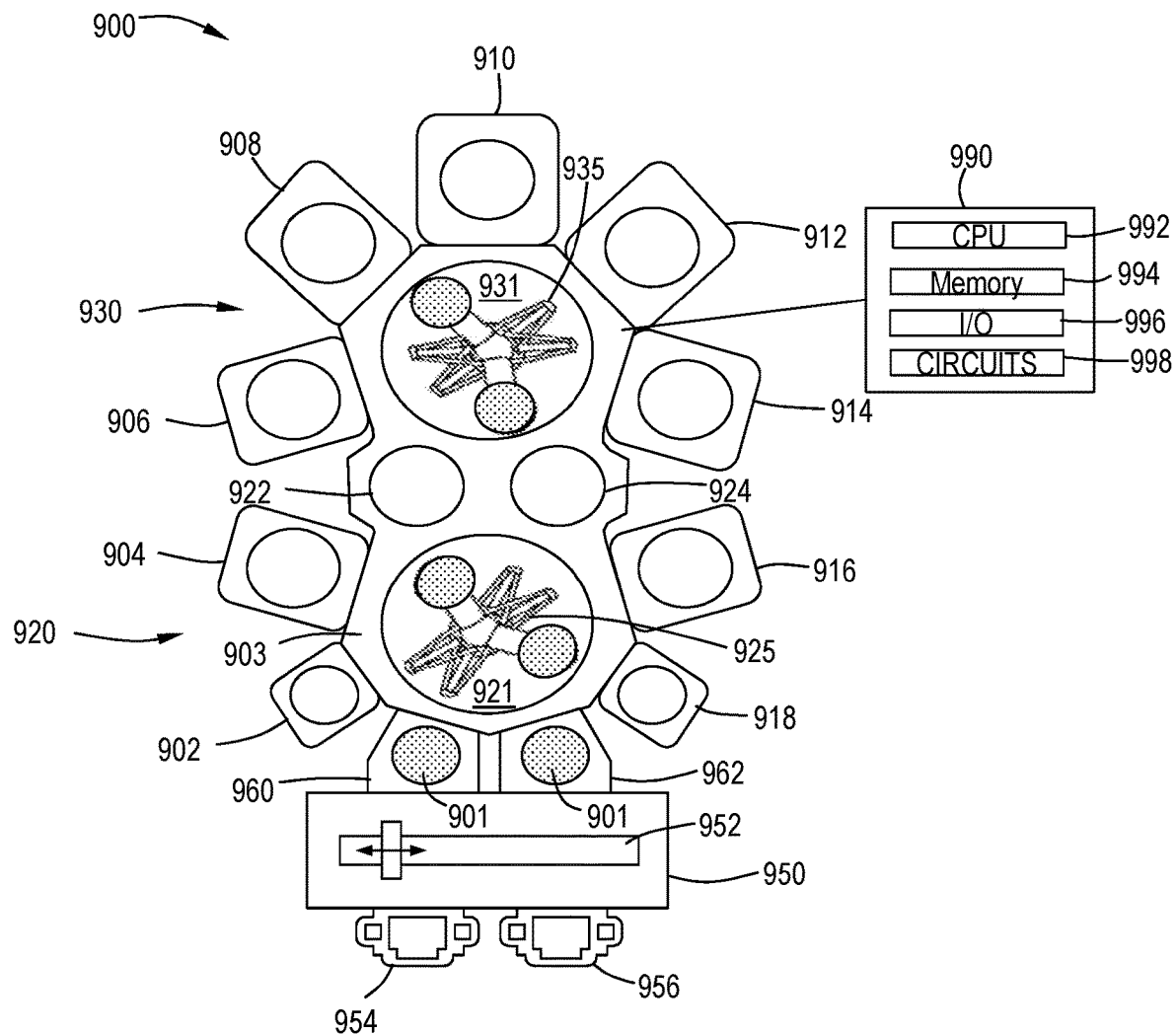
FIG. 21 illustrates a cluster tool according to one or more embodiments.

Additional embodiments of the disclosure are directed to processing tools 900 for the formation of the memory devices and methods described, as shown in FIG. 21.

With reference to FIG. 21, the cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a preclean chamber, a buffer chamber, transfer space(s), a wafer orienter/degas chamber, a cryo cooling chamber, a deposition chamber, annealing chamber, etching chamber and a blocking oxide material deposition chamber. The particular arrangement of process chambers and components can be varied depending on the cluster tool and should not be taken as limiting the scope of the disclosure.

In one or more embodiments, the cluster tool 900 includes a blocking oxide material deposition chamber. The a blocking oxide material deposition chamber of some embodiments comprises one or more of an atomic layer deposition chamber, a plasma enhanced atomic layer deposition chamber, a chemical vapor deposition chamber, a plasma enhanced chemical vapor deposition chamber, a spatial atomic layer deposition chamber, or a physical deposition chamber. In one or more embodiments, the cluster tool 900 includes a pre-cleaning chamber connected to the central transfer station.

In the embodiment shown in FIG. 21, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In one or more embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930, or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit (CPU) 992, memory 994, inputs/outputs (I/O) 996, and support circuits 998. The controller 990 may control the processing tool 900 directly, or via computers (or controllers) associated with particular process chamber and/or support system components.

In one or more embodiments, the controller 990 may be one of any form of general-purpose computer processor that can be used in an industrial setting for controlling various chambers and sub-processors. The memory 994 or computer readable medium of the controller 990 may be one or more of readily available memory such as non-transitory memory (e.g. random access memory (RAM)), read only memory (ROM), floppy disk, hard disk, optical storage media (e.g., compact disc or digital video disc), flash drive, or any other form of digital storage, local or remote. The memory 994 can retain an instruction set that is operable by the processor (CPU 992) to control parameters and components of the processing tool 900.

The support circuits 998 are coupled to the CPU 992 for supporting the processor in a conventional manner. These circuits include cache, power supplies, clock circuits, input/output circuitry and subsystems, and the like. One or more processes may be stored in the memory 994 as software routine that, when executed or invoked by the processor, causes the processor to control the operation of the processing tool 900 or individual processing units in the manner described herein. The software routine may also be stored and/or executed by a second CPU (not shown) that is remotely located from the hardware being controlled by the CPU 992.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 990 has one or more configurations to execute individual processes or sub-processes to perform the method. The controller 990 can be connected to and configured to operate intermediate components to perform the functions of the methods. For example, the controller 990 can be connected to and configured to control a physical vapor deposition chamber.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of manufacturing an electronic device, the method comprising:
   providing a substrate having an active region with at least one gate stack formed thereon, the at least one gate stack having a first side and a second side and comprising a gate metal having a thickness in a range of about 0.5 nm to about 2000 nm, a source/drain on the substrate, and a sacrificial material on the source/drain;
   forming pillars on the gate metal;
   forming a spacer material on the first side and second side of the pillars;
   removing the sacrificial material to form an opening to the source/drain;
   depositing a metal in the opening to form a source/drain contact;
   removing the pillars to form trenches; and
   depositing a dielectric material through the trenches onto the gate metal.

2. The method of claim 1, further comprising recessing the source/drain contact to form gaps between the pillars and depositing a second dielectric material into the gaps.

3. The method of claim 1, further comprising, prior to depositing a metal, depositing a liner material in the trenches to form a contact liner around the source/drain contact.

4. The method of claim 1, wherein a gate liner surrounds the gate metal.

5. The method of claim 1, further comprising selectively growing a seed layer on the gate metal, wherein the pillars are formed on the seed layer.

6. The method of claim 4, further comprising, prior to depositing the dielectric material, removing the gate liner and etching the spacer material.

7. The method of claim 1, further comprising, prior to depositing the dielectric material, removing the spacer material.

8. The method of claim 6, further comprising depositing a contact on the source/drain contact.

\* \* \* \* \*